(12) United States Patent
Russ et al.

(10) Patent No.: US 9,490,206 B2
(45) Date of Patent: Nov. 8, 2016

(54) ELECTRICAL DEVICE AND FABRICATION METHOD

(75) Inventors: Christian Russ, Diedorf (DE);
Gunther Lehmann, Holzkirchen (DE);
Franz Ungar, Munich (DE)

(73) Assignee: Infineon Technologies AG, Neubiberg (DE)

( * ) Notice: Subject to any disclaimer, the term of this patent is extended or adjusted under 35 U.S.C. 154(b) by 353 days.

(21) Appl. No.: 13/620,955

(22) Filed: Sep. 15, 2012

(65) Prior Publication Data

US 2013/0009254 A1    Jan. 10, 2013

Related U.S. Application Data

(62) Division of application No. 12/031,321, filed on Feb. 14, 2008, now Pat. No. 8,274,132.

(51) Int. Cl.
| | |
|---|---|
| *H01L 27/06* | (2006.01) |
| *H01L 27/10* | (2006.01) |
| *H01L 23/525* | (2006.01) |
| *H01L 29/78* | (2006.01) |

(52) U.S. Cl.
CPC ......... *H01L 23/5256* (2013.01); *H01L 29/785* (2013.01); *H01L 2924/0002* (2013.01)

(58) Field of Classification Search
CPC ...................................................... H01L 27/10
USPC ........................................................ 438/381
See application file for complete search history.

(56) References Cited

U.S. PATENT DOCUMENTS

| | | | |
|---|---|---|---|
| 5,854,103 A * | 12/1998 | Liang | 438/238 |
| 6,965,155 B2 * | 11/2005 | Fukaura | 257/510 |
| 7,067,359 B2 | 6/2006 | Wu | |
| 2005/0093154 A1 | 5/2005 | Kottantharayil et al. | |
| 2006/0166456 A1 * | 7/2006 | Fujiwara et al. | 438/399 |
| 2006/0208274 A1 | 9/2006 | Wu | |
| 2007/0026579 A1 | 2/2007 | Nowak et al. | |
| 2007/0029576 A1 * | 2/2007 | Nowak et al. | 257/209 |

* cited by examiner

*Primary Examiner* — Kenneth Parker
*Assistant Examiner* — Christopher Culbert
(74) *Attorney, Agent, or Firm* — Slater Matsil, LLP

(57) ABSTRACT

An electrical device with a fin structure, a first section of the fin structure having a first width and a first height, a second section of the fin structure having a second width and a second height, wherein the first width is smaller than the second width and the first height is lower than the second height.

17 Claims, 12 Drawing Sheets

FIG 2  200

220 — Forming a fin structure on a substrate, a first section of the fin structure comprising a first width and a first height, and a second section of the fin structure comprising a second width and a second height, wherein the first width is smaller than the second width and the first height is lower than the second height.

FIG 3  300

320 — Forming a first fin and a second fin on a substrate, the first and second fins being separated by a gap.

340 — Growing an epitaxial layer on the first and second fins such that a fusible link region is formed in the gap between the first and second fins.

FIG 4  400

420 — Forming a fin on a substrate

440 — Growing an epitaxial layer on the fin, wherein a portion of the fin is blocked from the epitaxial growth to form a fusible link region of the fin.

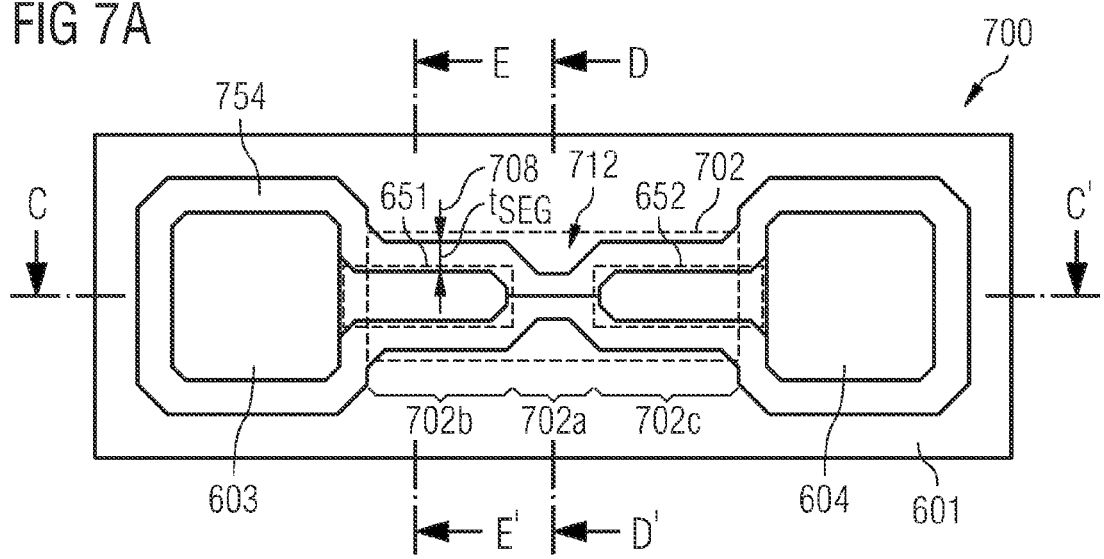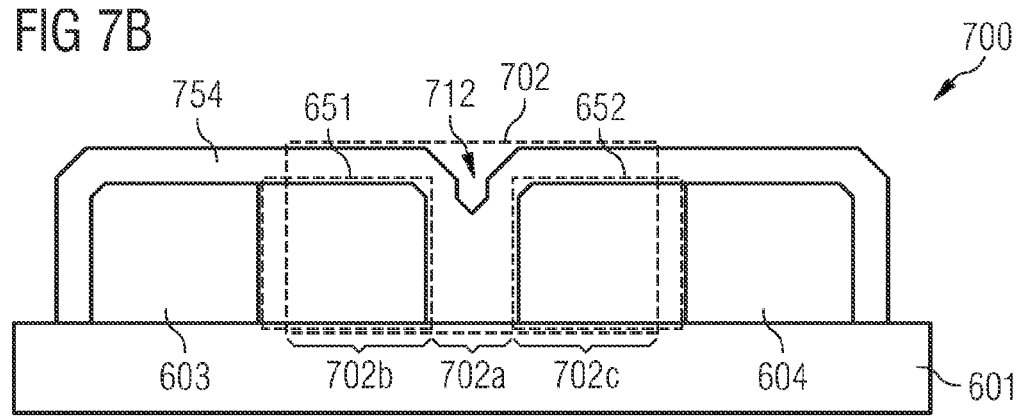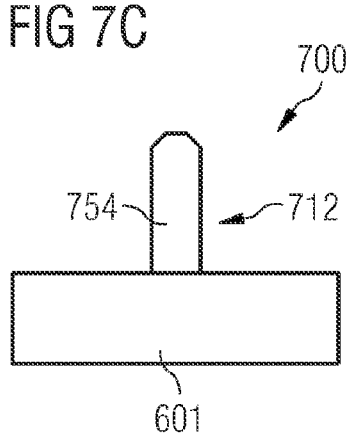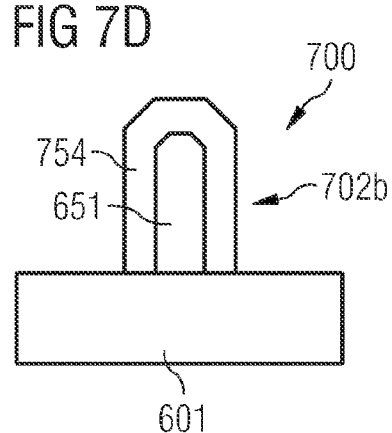

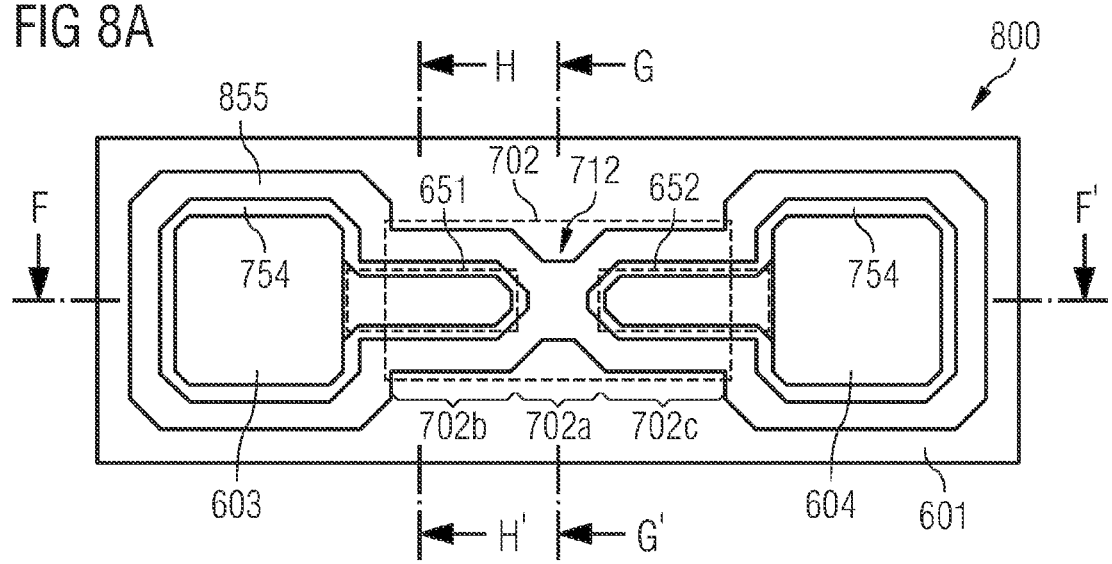
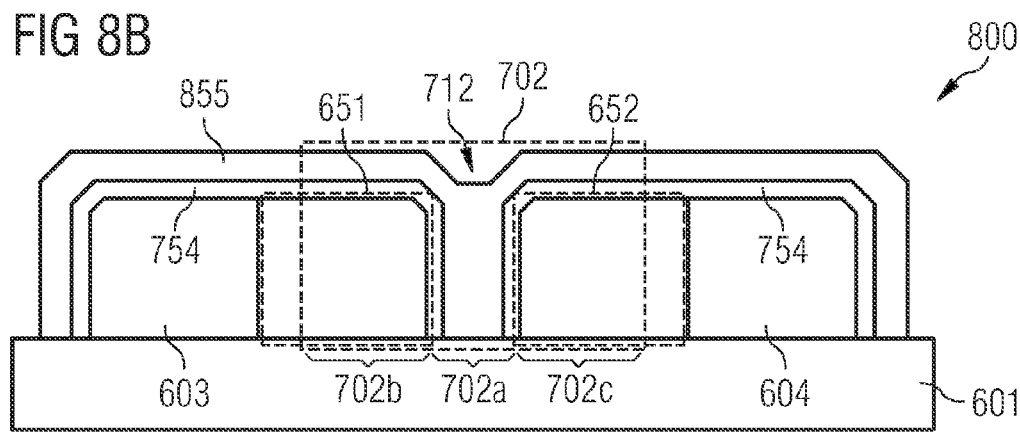
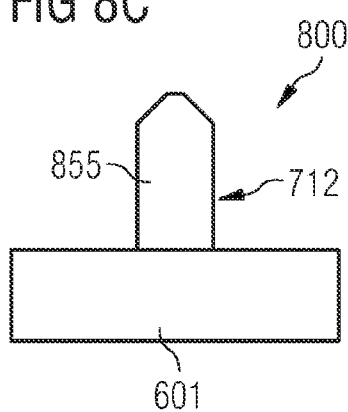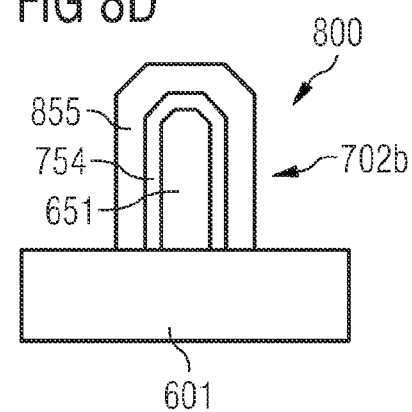

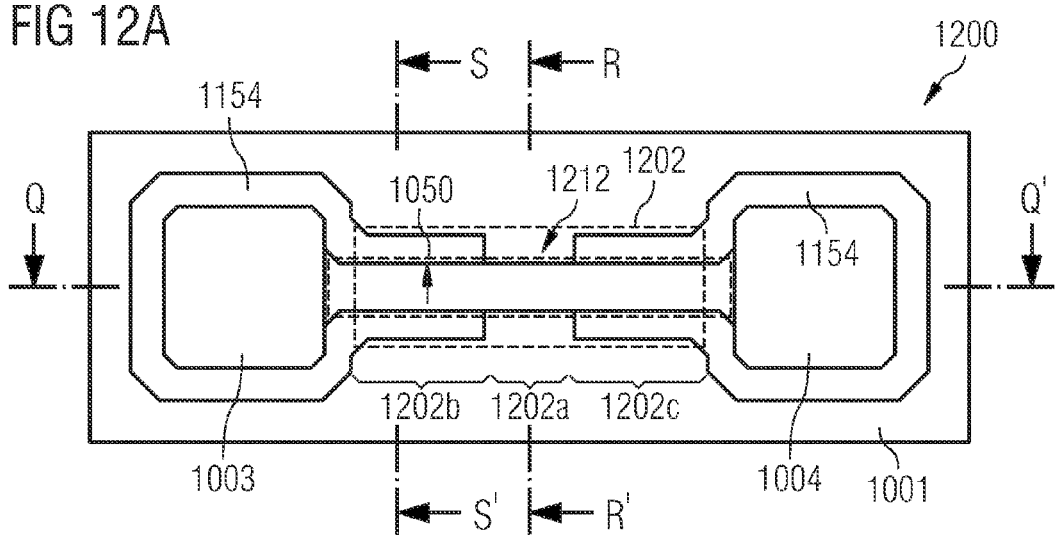
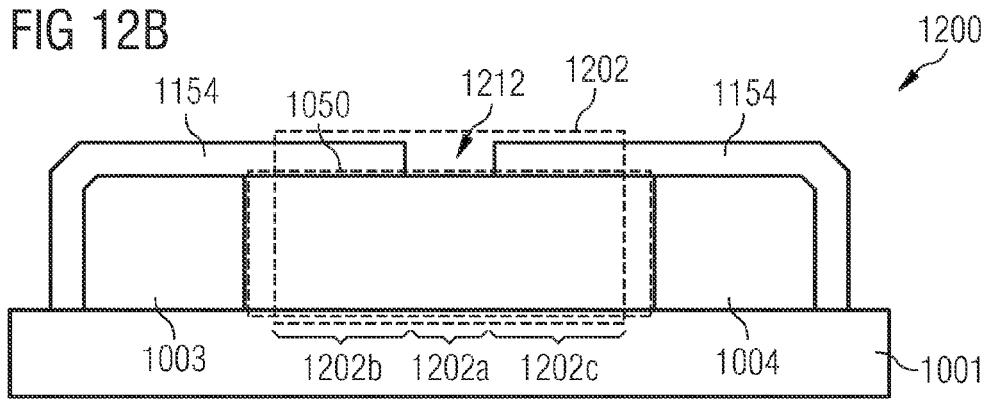
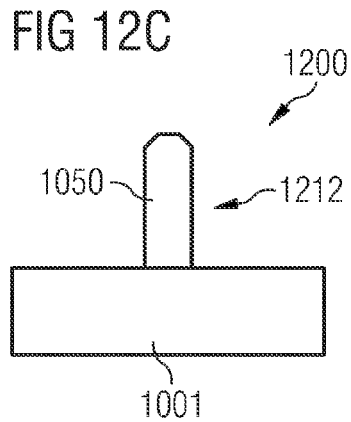 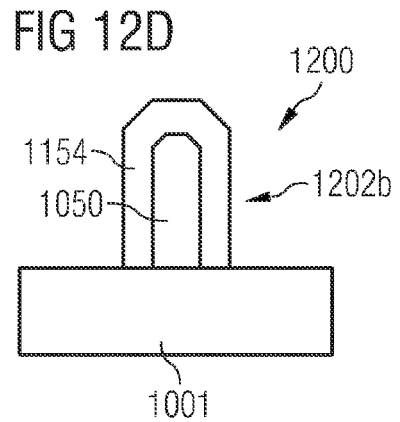

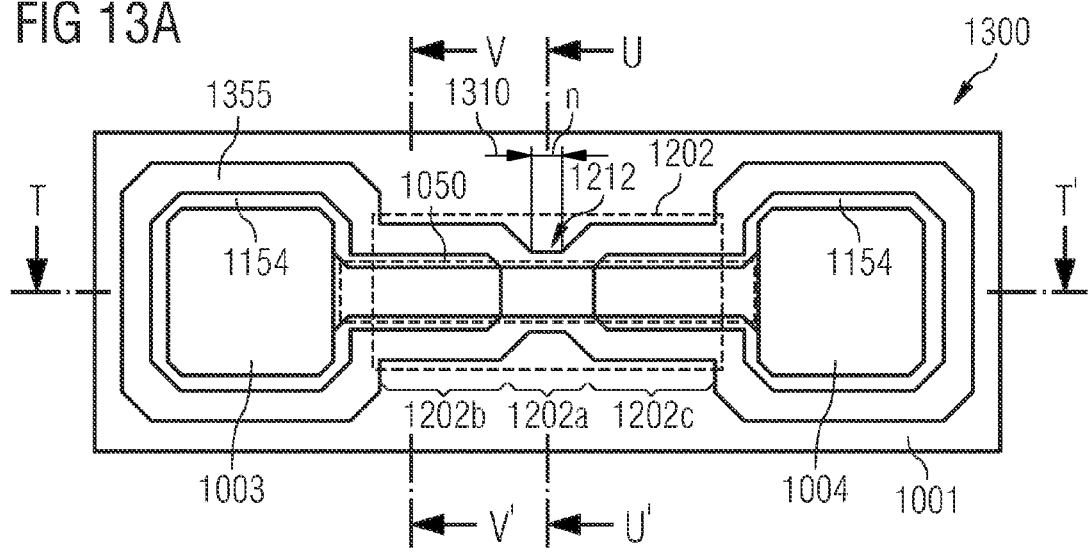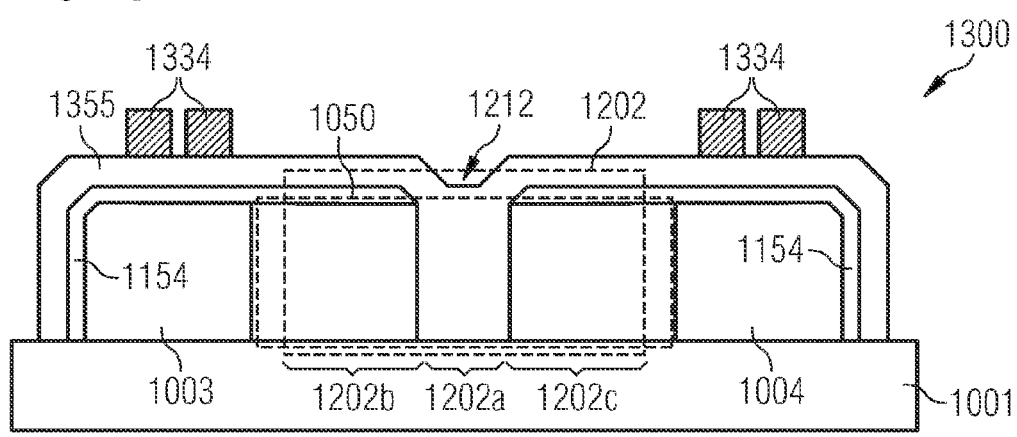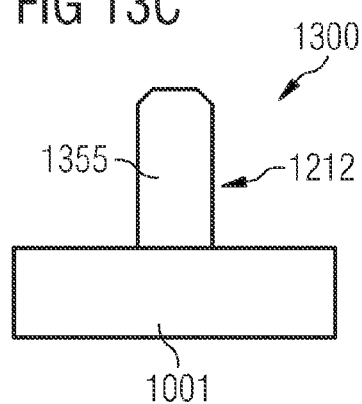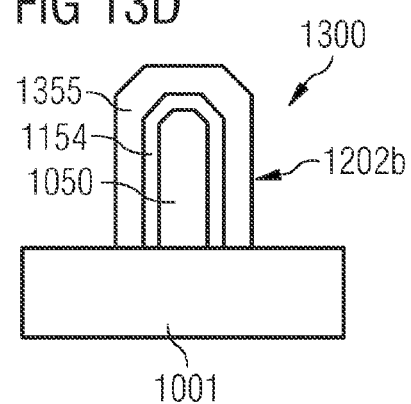

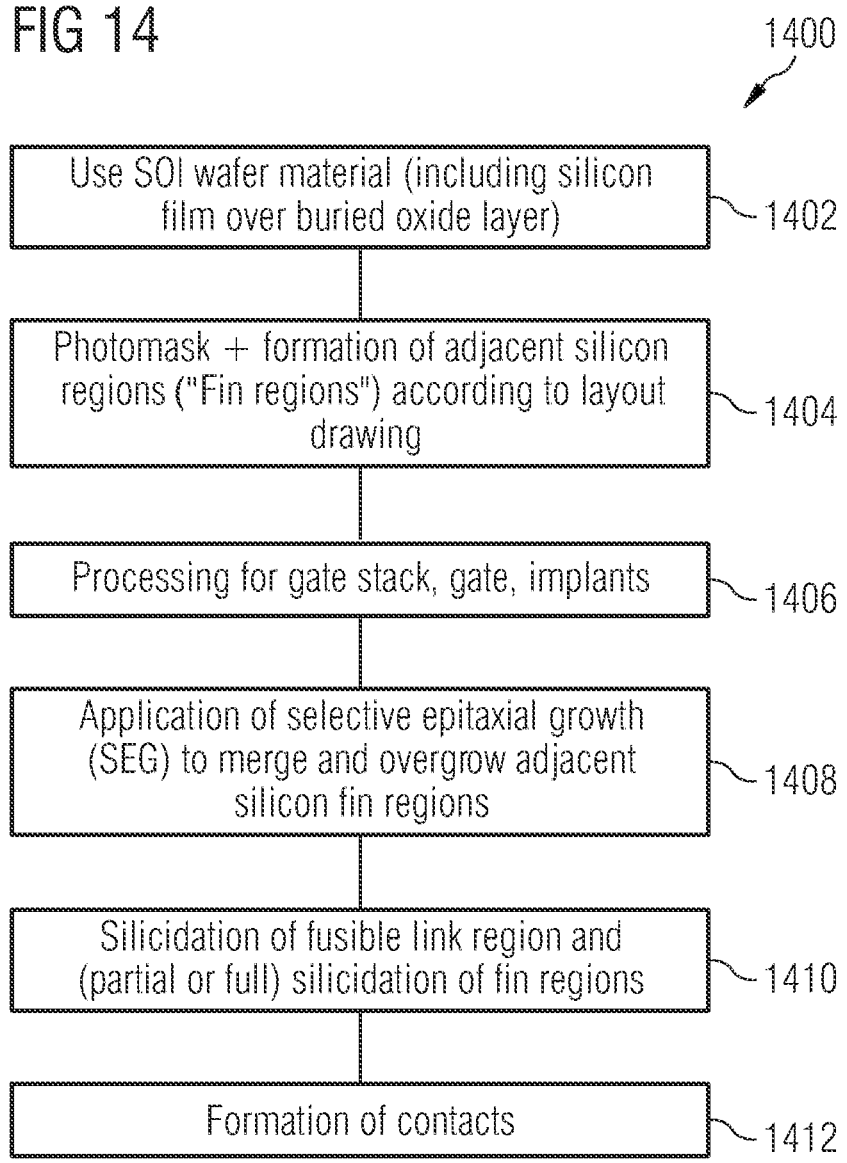

US 9,490,206 B2

1

ELECTRICAL DEVICE AND FABRICATION METHOD

This is a divisional application of U.S. application Ser. No. 12/031,321, entitled "Electrical Device and Fabrication Method," which was filed on Feb. 14, 2008 and is incorporated herein by reference.

TECHNICAL FIELD

Embodiments of the present invention relate generally to electrical devices, and, in accordance with some embodiments, to electrical fuse devices for fin field-effect transistor (FinFET) or silicon-on-insulator (SOI) technologies.

BACKGROUND

Multigate field-effect transistor (MuGFET) devices or fin field-effect transistor (FinFET) devices are expected to be used in the future due to the limited down-scaling capability of conventional planar or bulk CMOS technologies (CMOS: complementary metal oxide semiconductor). A fin field-effect transistor (FinFET) may be understood to mean a field-effect transistor having a fin structure. A fin structure or fin may, for example, include a ridge structure or a bridge structure, which is formed or freely suspended on a substrate. A multi-gate field effect-transistor (MuGFET) may, for example, include a field-effect transistor, in which a channel region is driven by two or more gates.

FinFET devices are typically designed for high-speed logic core applications featuring low supply voltages (e.g., 0.8 V to 1.2 V). The process development is usually focused on these standard MOSFET devices. The availability of devices beyond standard MOSFET devices and their integration into the process flow may contribute to make MuGFET or FinFET technologies interesting for, e.g., System-on-Chip (SOC) applications. Electrical fuses or electrically programmable fuses (E-fuses) are one device class that may be used here.

Programming an electrical fuse may typically be achieved by passing an electrical current of sufficient magnitude through the fuse for a sufficient period of time such that a conductive link (also referred to as a fuse link or fusible link) of the fuse is blown or ruptured, thereby increasing the resistance of the fuse. A sensing circuit may be used to sense the resistance and thus determine the state of the fuse.

E-fuses may, for example, allow for the programming of certain functions of an integrated circuit such as personalization and activation/deactivation of functional blocks.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2 shows a method for fabricating an electrical device in accordance with another embodiment;

FIG. 3 shows a method for fabricating an electrical fuse device in accordance with another embodiment;

FIG. 4 shows a method for fabricating an electrical fuse device in accordance with another embodiment;

2

Figure 5A:
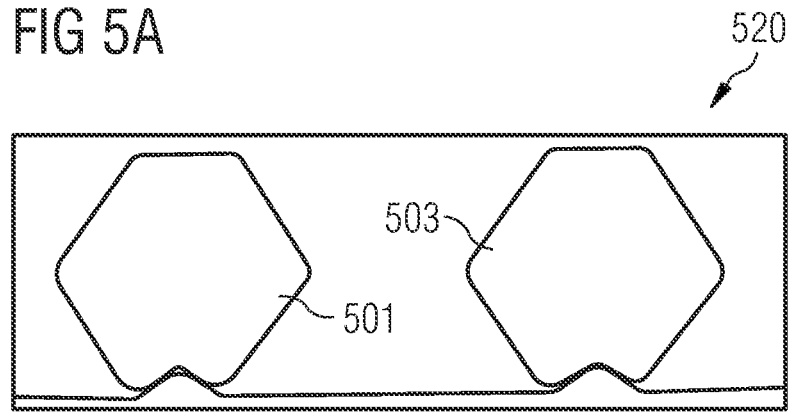
Figure 5B:
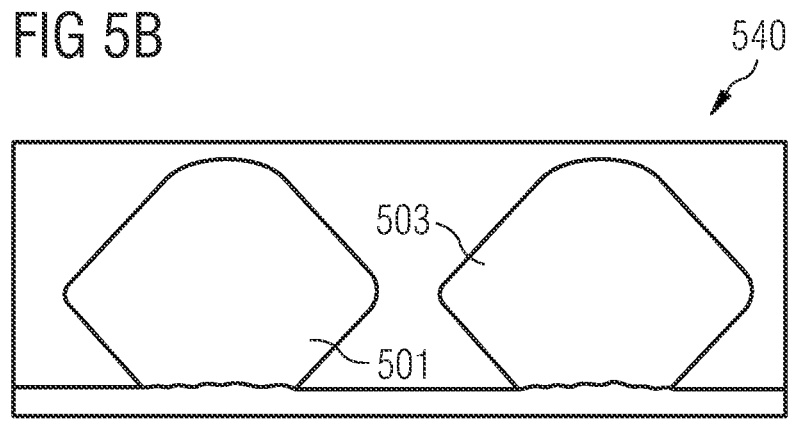
Figure 5C:
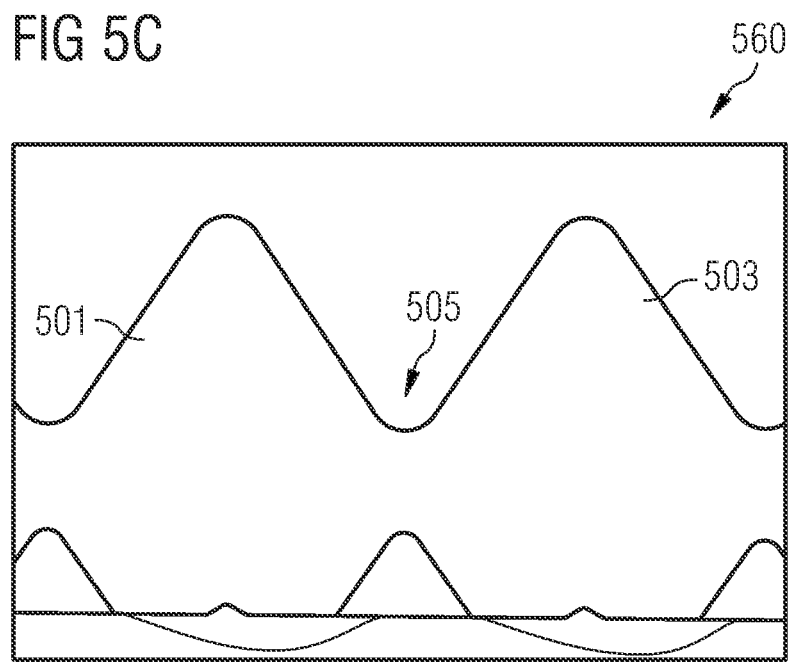

FIGS. 5A to 5C show schematic views illustrating different stages in a selective epitaxial growth process;

FIGS. 6A, 6B and 7A to 7D show different views illustrating a method for fabricating an electrical fuse device in accordance with another embodiment;

FIGS. 8A to 8D show an electrical fuse device in accordance with another embodiment;

FIGS. 9A to 9D show an electrical fuse device in accordance with another embodiment;

FIGS. 10A, 10B and 11A to 11D show different views illustrating a method for fabricating an electrical fuse device in accordance with another embodiment;

FIGS. 12A to 12D show an electrical fuse device in accordance with another embodiment;

FIGS. 13A to 13D show an electrical fuse device in accordance with another embodiment; and FIG. 14 shows a method for fabricating an electrical fuse device in accordance with another embodiment.

DETAILED DESCRIPTION OF ILLUSTRATIVE EMBODIMENTS

Figure 1A:
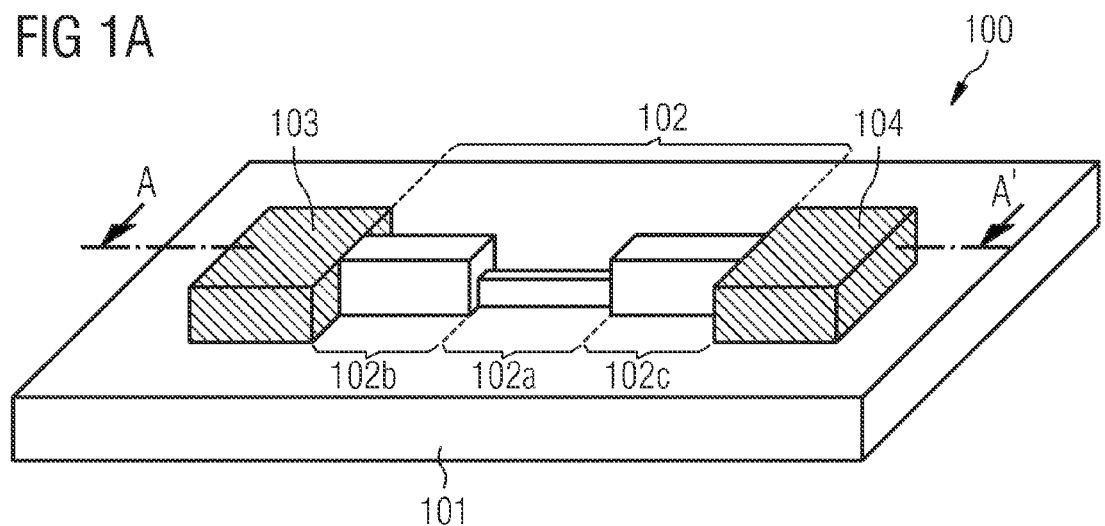
FIGS. 1A to 1C show different views of an electrical device in accordance with an embodiment.
Figure 1B:
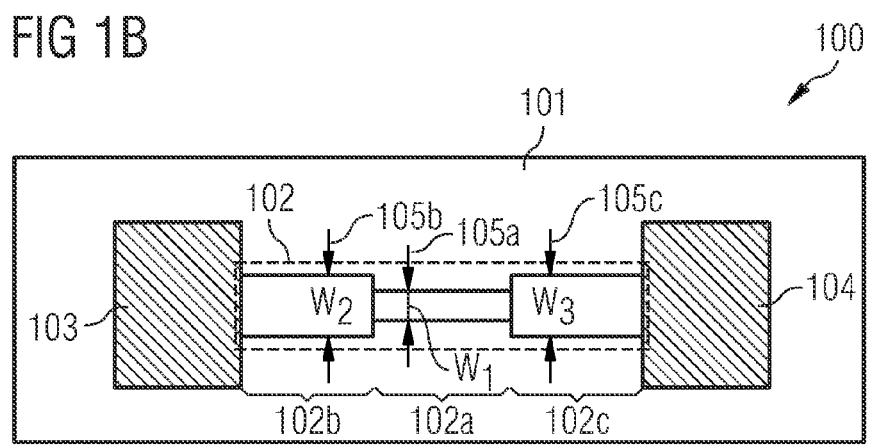

FIG. 1A shows a schematic perspective view of an electrical device 100 in accordance with an embodiment of the invention. FIG. 1B shows a plan view of the electrical device 100, and FIG. 1C shows a cross-sectional view of the electrical device 100 along the line A-A' in FIG. 1A.

The electrical device 100 includes a fin structure 102. The fin structure 102 includes a first section 102a that has a first width $w_1$ (indicated by the arrows 105a in FIG. 1B) and a first height $h_1$ (indicated by the arrows 106a in FIG. 1C), and a second section 102b that has a second width $w_2$ (indicated by arrows 105b in FIG. 1B) and a second height $h_2$ (indicated by arrows 106b in FIG. 1C), wherein the first width $w_1$ is smaller than the second width $w_2$ (i.e., $w_1 < w_2$) and the first height $h_1$ is lower than the second height $h_2$ (i.e., $h_1 < h_2$). In this context, the "height" of a section of the fin structure 102 may be understood to mean the dimension of that section in a direction perpendicular to a surface (e.g., perpendicular to a substrate surface or main processing surface), on or above which the electrical device 100 or the fin structure 102 is arranged (see FIG. 1C). The "width" of a section of the fin structure 102 may be understood to mean the dimension of that section in a direction perpendicular to the height and essentially perpendicular to a current flow direction in that section.

In accordance with an embodiment, the fin structure 102 may further include a third section 102c having a third width $w_3$ (indicated by arrows 105c in FIG. 1B) and a third height $h_3$ (indicated by arrows 106c in FIG. 1C), wherein the second section 102b and the third section 102c are electrically connected with each other via the first section 102a, as shown in FIG. 1A.

Figure 1C:
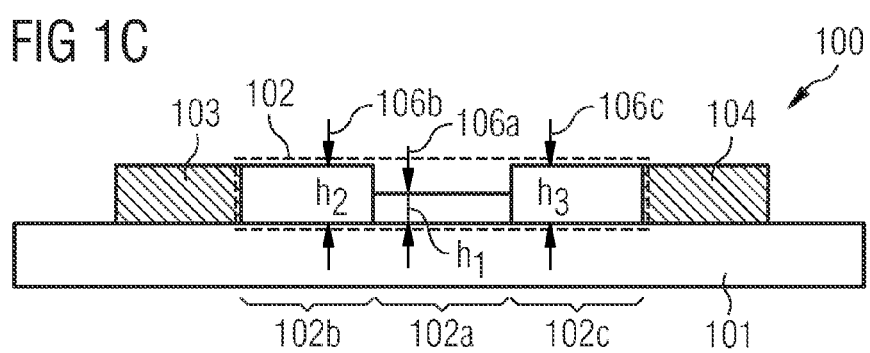

In accordance with an embodiment, the third width $w_3$ may be approximately the same as the second width (that is, approximately equal to $w_2$ as shown in FIG. 1B), and/or the third height $h_3$ may be approximately the same as the second height (that is, approximately equal to $h_2$ as shown in FIG. 1C), although in accordance with alternative embodiments, the third width $w_3$ (i.e., the width of the third section 102c) may be different from the second width $w_2$ (i.e., the width of the second section 102b) and/or the third height $h_3$ (i.e., the height of the third section 102c) may be different from the second height $h_2$ (i.e., the height of the second section 102b).

In accordance with one embodiment, the first section 102a may be arranged between the second section 102b and the third section 102c, as shown in FIGS. 1A to 1C. Clearly, the second and third sections 102b, 102c may abut the first section 102a at opposite ends of the first section 102a.

In accordance with some embodiments, the electrical device 100 may be arranged on or above a substrate 101 (as shown in FIG. 1A to FIG. 1C), for example, on or above a semiconductor substrate, e.g., on or above a silicon substrate (for example, a silicon bulk substrate) or a silicon-on-insulator (SOI) substrate in accordance with an embodiment, although other suitable substrates may be used in accordance with other embodiments. In case that the electrical device 100 is arranged on or above an SOI substrate, the fin structure 102 may be arranged on a buried oxide (BOX) layer of the SOI substrate and may be formed from a thin silicon top layer of the SOI substrate, in accordance with an embodiment. In case that the electrical device 100 is arranged on or above a silicon bulk substrate, the fin structure 102 may be formed from a silicon layer near the surface of the silicon bulk substrate, in accordance with an embodiment.

In accordance with another embodiment, the electrical device 100 may further include at least one contact structure (or contact region) connected to and/or abutting the fin structure 102 of the electrical device. For example, in accordance with one embodiment, the electrical device 100 may include a first contact region 103 formed adjacent to the second section 102b of the fin structure 102 and electrically connected to the second section 102b, and a second contact region 104 formed adjacent to the third section 102c of the fin structure and electrically connected to the third section 102c, as shown in FIG. 1A to FIG. 1C. The contact regions 103, 104 may have a considerably larger width than the fin structure 102, for example, in order to reduce contact resistances.

In accordance with one embodiment, the fin structure 102 may have a symmetrical shape. In other words, the second section 102b and the third section 102c of the fin structure 102 may have about the same length, wherein the length of a section is understood to mean the dimension of the section in a direction perpendicular to the width and to the height of that section. To put it in still other words, the first section 102a of the fin structure 102 may be centered, as shown in FIG. 1A to FIG. 1C. In accordance with other embodiments, the fin structure 102 may have an asymmetrical shape. That is, the second section 102b may have a length that is different from the length of the third section 102c.

In accordance with one embodiment, the third section 102c may not be present. In this case, the first section 102a of the fin structure 102 may be directly connected to the second contact region 104, in accordance with an embodiment.

In accordance with one embodiment, the fin structure 102 may further include a fin core structure and a layer formed on the fin core structure in at least one of the second and third sections 102b, 102c of the fin structure 102 (not shown, see FIG. 12A). The fin core structure may have sidewalls and a top surface, and the layer may, for example, be formed on the sidewalls and/or on the top surface of the fin core structure in the second and third sections 102b, 102c of the fin structure 102. In other words, in the second section 102b and/or in the third section 102c of the fin structure 102, the sidewalls and/or the top surface of the fin core structure may be covered by the layer.

In accordance with another embodiment, the layer may also be formed on at least one of the first and second contact regions 103, 104.

In accordance with another embodiment, the layer formed on the fin core structure may be formed (in other words, deposited) by means of a selective epitaxial growth (SEG) process. In other words, the layer may be an epitaxial layer that has been grown selectively on the fin core structure.

For example, in accordance with some embodiments, the fin core structure may include or may be made of a crystalline material, for example, a crystalline semiconductor material such as, e.g., silicon, and the layer may be formed on the fin core structure by growing an epitaxial layer (e.g., an epitaxial silicon layer or an epitaxial silicon-germanium (SiGe) layer in case of a silicon fin core structure) selectively on the crystalline material of the fin core structure. The crystalline material of the fin core structure may clearly serve as seed material for the SEG growth.

Clearly, in accordance with one embodiment, the fin structure 102 may include a fin core structure that is partially covered by a layer (e.g., the epitaxially grown layer), wherein an uncovered portion of the fin core structure corresponds to the first section 102a of the fin structure 102 and wherein the covered portion or portions of the fin core structure correspond to the second section 102b and (if present) to the third section 102c of the fin structure 102.

In accordance with one embodiment, the first section 102a of the fin structure 102 and/or the layer formed in the second and third sections 102b, 102c of the fin structure 102 (for example, the epitaxially grown layer) may be at least partially silicided. In other words, in accordance with this embodiment, the silicon material of the fin core structure in the first section 102a of the fin structure 102 and/or the layer (e.g., the epitaxially grown silicon layer) formed on the fin core structure in the second section 102b and/or in the third section 102c of the fin structure 102 may be partially silicided (in other words, partially transformed into a silicide) or even fully silicided (in other words, fully transformed into a silicide). Furthermore, in accordance with another embodiment, the fin core structure itself may be partially or fully silicided in the second section 102b and/or in the third section 102c of the fin structure 102.

In accordance with another embodiment, the second section 102b of the fin structure 102 may include a first partial fin core structure and/or the third section 102c of the fin structure 102 may include a second partial fin core structure (not shown, see, e.g., FIG. 7A). Furthermore, the fin structure 102 may include a layer formed on the first and second partial fin core structures and further in the first section 102a of the fin structure 102 such that the first and second partial fin core structures are electrically connected with each other via the layer (not shown, see, e.g., FIG. 7A). Each of the first and second partial fin core structures may have sidewalls and a top surface, and the layer may be formed on the sidewalls and on the top surface of the first and second partial fin core structures, and furthermore between the first and second partial fin core structures. In other words, the sidewalls and/or the top surface of the first partial fin core structure in the second section 102b of the fin structure 102 and/or the sidewalls and/or the top surface of the second partial fin core structure in the third section 102c of the fin structure 102 may be covered by the layer.

In accordance with one embodiment, the layer may be formed by means of a selective epitaxial growth (SEG) process in a similar manner as described herein above. That is, an epitaxial layer may be grown selectively on the first and second partial fin core structures.

For example, in accordance with some embodiments, the first partial fin core structure and/or the second partial fin core structure may include or may be made of a crystalline material, for example, a crystalline semiconductor material such as, e.g., silicon, and the layer may be formed on the first and/or second partial fin core structure(s) by growing an epitaxial layer (e.g., an epitaxial silicon layer or an epitaxial silicon-germanium (SiGe) layer in case of a silicon fin core structure) selectively on the crystalline material of the first and/or second partial fin core structure(s).

Clearly, in accordance with one embodiment, the fin structure 102 may include a first partial fin core structure (in the second section 102b) and/or a second partial fin core structure (in the third section 102c), wherein the first and/or second partial fin core structures are/is covered by a layer (e.g., the epitaxially grown layer), and wherein the layer is also formed between the first and second partial fin core structures (or between the first partial fin core structure and the second contact region 104, if there is no second partial fin core structure present in the fin structure 102), thereby bridging the distance between the first and second partial fin core structures (or between the first partial fin core structure and the second contact region 104).

Clearly, in accordance with this embodiment, that portion of the layer (e.g., the epitaxially grown layer) that bridges the space between the first and second partial fin core structures (or between the first partial fin core structure and the second contact region 104 if no second partial fin core structure is present in the fin structure 102), corresponds to the first section 102a of the fin structure 102 while the first and/or second partial fin core structures covered with the layer (e.g., the epitaxially grown layer) correspond to the second section 102b and/or third section 102c of the fin structure 102.

In accordance with some embodiments, at least one of the first section 102a, the second section 102b and the third section 102c of the fin structure 102 may be at least partially silicided. For example, in accordance with one embodiment, the first section 102a (clearly, the layer (e.g. the epitaxially grown layer) formed between the first and second partial fin core structures) may be partially silicided (that is, partially transformed into a silicide). Alternatively, the first section 102a may be fully silicided (that is, fully transformed into a silicide). In accordance with another embodiment, that portion of the layer (e.g., the epitaxially grown layer) formed on the first and/or second partial fin core structure may also be partially or fully silicided. In accordance with another embodiment, the first partial fin core structure and/or the second partial fin core structure may be partially or fully silicided.

In accordance with another embodiment, one or more electrical contacts may be formed on the first contact region 103 and/or on the second contact region 104 to electrically contact the first and second contact regions 103, 104.

In accordance with one embodiment, the electrical device 100 may be configured as an electrical fuse device, for example, as an electrically programmable fuse (E-fuse), wherein the first section 102a of the fin structure 102 may include (or form) a fusible link region of the fuse device. The fuse device may also be referred to as a "FinFuse". Clearly, the fusible link region of the fuse device has a narrower width and a lower height than the other sections of the fin structure 102 such that the fusible link region may serve as a rupture or break point of the fuse device, if an electrical current of sufficient magnitude is passed through the device.

FIG. 2 shows a method 200 for fabricating an electrical device in accordance with another embodiment.

In 220, a fin structure is formed on a substrate. A first section of the fin structure has a first width and a first height, and a second section of the fin structure has a second width and a second height, wherein the first width is smaller than the second width and the first height is lower than the second height.

In accordance with one embodiment, the fin structure is formed such that it further includes a third section having the second width and the second height, wherein the second and third sections of the fin structure are electrically connected with each other via the first section of the fin structure.

In accordance with another embodiment, forming the fin structure includes forming a first partial fin core structure and a second partial fin core structure on the substrate, the first and second partial fin core structures being separated by a gap, and forming a layer on the first and second partial fin core structures, thereby bridging the gap and forming an electrically conductive link between the first and second partial fin core structures. Each of the first and second partial fin core structures may have sidewalls and a top surface, and in accordance with one embodiment, the layer is formed on the sidewalls and on the top surface of the first and second partial fin core structures.

In accordance with another embodiment, the first and second partial fin core structures include or consist of a crystalline material, and forming the layer on the first and second partial fin core structures includes growing an epitaxial layer selectively on the crystalline material of the first and second partial fin core structures.

In accordance with another embodiment, after formation of the layer, the layer is at least partially silicided.

In accordance with another embodiment, forming the fin structure includes forming a fin core structure on the substrate and forming a layer on the fin core structure, wherein the formation of the layer is blocked in a portion of the fin core structure that corresponds to the first section of the fin structure.

In accordance with another embodiment, the fin core structure includes or is made of a crystalline material, wherein forming the layer on the fin core structure includes growing an epitaxial layer selectively on the crystalline material of the fin core structure. In other words, the layer may be formed by means of a selective epitaxial growth (SEG) process.

In accordance with another embodiment, the blocking of the formation of the selectively grown epitaxial layer (SEG layer) may be achieved by means of a blocking layer for the SEG growth that may be formed on the fin core structure before formation of the SEG layer. In accordance with one embodiment, the blocking layer may be a nitride layer. In accordance with other embodiments, though, the blocking layer may include or may be made of other materials.

In accordance with another embodiment, at least one of the blocked portion of the fin core structure and the layer formed on the fin core structure may be at least partially silicided. In other words, the blocked portion of the fin core structure and/or the layer formed on the fin core structure may be partially or fully silicided. Furthermore, in accordance with another embodiment, the fin core structure may be at least partially silicided.

In accordance with another embodiment, the blocking layer (e.g., the nitride layer) may be re-used as a silicide blocking layer during the silicidation of the layer formed on the fin core structure.

FIG. 3 shows a method 300 for fabricating an electrical fuse device in accordance with another embodiment.

In 320, a first fin and a second fin are formed on a substrate, the first and second fins being separated by a gap.

In 340, an epitaxial layer is grown on the first and second fins such that a fusible link region is formed in the gap between the first and second fins.

Clearly, the growth of the epitaxial layer on the first and second fins may lead to the merging of the fins such that an electrically conductive connection is formed between the fins by material of the epitaxial layer.

In accordance with an embodiment, at least one of the fusible link region and the epitaxial layer may be at least partially silicided.

In accordance with some embodiments, the fusible link region may have a smaller cross-sectional area than the remaining portions of the first and second fins. For example, in accordance with one embodiment, the fusible link region may have a smaller width than the remaining fin portions. In accordance with another embodiment, the fusible link region may have a lower height than the remaining fin portions. In accordance with still another embodiment, the fusible link region may have both a smaller width and a lower height than the remaining fin portions.

FIG. 4 shows a method 400 for fabricating an electrical fuse device in accordance with another embodiment.

In 420, a fin is formed on a substrate.

In 440, an epitaxial layer is grown on the fin, wherein a portion of the fin is blocked from the epitaxial growth to form a fusible link region of the fin.

In accordance with an embodiment, at least one of the fusible link region and the epitaxial layer is at least partially silicided.

In accordance with some embodiments, the fusible link region may have a smaller cross-sectional area than the remaining portions of the fin. For example, in accordance with one embodiment, the fusible link region may have a smaller width than the remaining fin portions. In accordance with another embodiment, the fusible link region may have a lower height than the remaining fin portions. In accordance with still another embodiment, the fusible link region may have both a smaller width and a lower height than the remaining fin portions.

FIG. 5A to FIG. 5C show schematic views illustrating three different stages 520, 540 and 560 of a selective epitaxial growth (SEG) process as may be applied in a typical FinFET process. It is shown that a material bridge 505 is formed between a first fin 501 and a second fin 503 by the SEG process. In this context, it is noted that the facet-like SEG growth, as shown in FIGS. 5A to 5C, is typical for a <100> crystal orientation. If a different crystal orientation is used (for example, a <110> crystal orientation) as an alternative, the facet-like growth may not be observed while a similar bridging of the fins may still be possible.

FIGS. 6A, 6B and 7A to 7D show different views illustrating a method for fabricating an electrical device in accordance with another embodiment. In accordance with this embodiment, an electrical fuse device (or E-fuse) is provided that may, for example, be used in FinFET or SOI technologies.

Figure 6A:
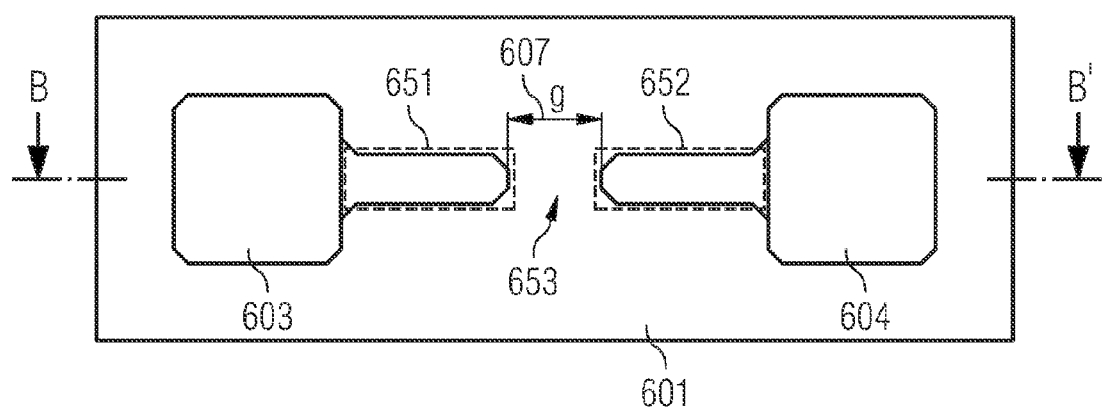
Figure 6B:
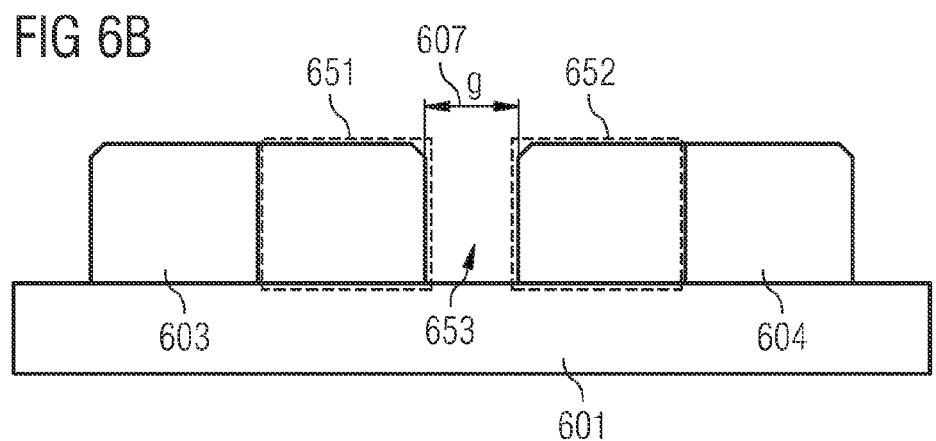

FIG. 6A and FIG. 6B show that a first partial fin core structure 651 and a second partial fin core structure 652 are formed on a substrate 601, which, in accordance with the embodiment shown, is a silicon-on-insulator (SOI) substrate. In accordance with other embodiments, different substrates, such as, for example, silicon bulk substrates, may be used. The SOI substrate 601 may include a buried oxide (BOX) layer, and the first and second partial fin core structures 651, 652 may be formed on the buried oxide layer of the substrate 601.

The first and second partial fin core structures 651, 652 are formed such that they are separated by a gap 653. The (shortest) distance "g" between the two partial fin core structures 651 and 652 (in other words, the dimension "g" of the gap 653) is indicated by the double arrow 607. In accordance with one embodiment, the gap "g" may be about less than two times the thickness of a layer to be formed on the first and second partial fin core structures 651, 652 (see FIG. 7A).

FIG. 6A is a surface-parallel cross-sectional view (in other words, a layout drawing) while FIG. 6B is a longitudinal cross-section along the line B-B' shown in FIG. 6A. It is noted that in accordance with the embodiment shown in FIGS. 6A and 6B, the first and second partial fin core structures 651, 652 are arranged on the substrate 601 such that they have a common longitudinal axis, which coincides with the cross-sectional line B-B'. In accordance with another embodiment, the second partial fin core structure 652 may be rotated (around a rotation axis that is perpendicular to the substrate surface) by an angle φ (e.g., 0<φ≤180°) with respect to the first partial fin core structure 651, or vice versa.

In accordance with the embodiment shown, the first and second partial fin core structures 651, 652 consist of silicon material with any doping. In accordance with other embodiments, the first and second partial fin core structures 651, 652 may include or may be made of other crystalline materials, e.g., other semiconductor materials such as, for example, compound semiconductor materials (e.g., SiGe, GaAs or other materials).

A first contact region 603 is formed adjacent to and abuts the first partial fin core structure 651, and a second contact region 604 is formed adjacent to and abuts the second partial fin core structure 652. The first and second contact regions 603, 604 may be used to electrically contact the electrical fuse device to be formed. In accordance with the embodiment shown, the first and second contact regions 603, 604 also consist of silicon, although, in accordance with other embodiments the first and second contact regions 603, 604 may include or may be made of other crystalline materials, e.g. other semiconductor materials. In accordance with one embodiment, the first and second contact regions 603, 604 may include or may be made of the same material or materials as the first and second partial fin core structures 651, 652.

Clearly, FIG. 6A and FIG. 6B show the formation of two separate silicon shapes on the substrate 601, i.e., a first silicon shape including the first partial fin core structure 651 and the first contact region 603, and a second silicon shape including the second partial fin core structure 652 and the second contact region 604, wherein each of the first and second silicon shapes has a fin-like extension (i.e., the first and second partial fin core structures 651 and 652, respectively), the extensions being adjacent to each other. The first and second partial fin core structures 651, 652 may be used to form an active fin region of the electrical fuse device as described hereinbelow.

The first and second silicon shapes may, for example, be formed by use of a standard FinFET or SOI process technology. For example, in accordance with an embodiment, an SOI wafer material (including a silicon film arranged on or above a buried oxide (BOX) layer) may be used. The silicon film may be structured using, for example, standard lithographical processes (using, e.g., a photomask) and etch processes such that the adjacent silicon regions, in other words the fin regions (i.e., the first and second partial fin core structures 651, 652) and the first and second contact regions 603, 604 are formed on the substrate 601 (e.g., on the buried oxide layer of the SOI substrate) in accordance with the layout drawing of FIG. 6A. In accordance with other embodiments, the first and second silicon shapes may be formed by use of a silicon bulk technology. For example, in accordance with one embodiment, a silicon bulk wafer may be used, and a silicon layer near the surface of the silicon bulk wafer may be structured in a similar manner as the silicon film of the SOI wafer as described above.

FIGS. 7A to 7D show that a layer 754 is formed on the first and second partial fin core structures 651, 652, thereby bridging the gap 653 and forming an electrically conductive link between the first and second partial fin core structures 651, 652. FIG. 7A is a surface-parallel cross-sectional view of the resulting structure 700, while FIG. 7B is a longitudinal cross-section along the line C-C', FIG. 7C is a transversal cross-section along the line D-D' and FIG. 7D is a transversal cross-section along the line E-E' shown in FIG. 7A.

In accordance with the embodiment shown, the layer 754 is a silicon layer that is formed by means of a selective epitaxial growth (SEG) process. In other words, the layer 754 is an epitaxial silicon layer that is grown selectively on the crystalline silicon material of the first and second partial fin core structures 651, 652. Clearly, the silicon material of the first and second partial fin core structures 651, 652 serves as seed silicon for the SEG growth of the silicon layer 754.

In accordance with other embodiments, for example, in case that the first and second partial fin core structures 651, 652 include or are made of other crystalline materials, also the layer 754 may include or may be made of other crystalline materials. In general, the layer 754 may include or may be made of any material or materials that may be epitaxially grown on the material or materials of the first and second partial fin core structures 651, 652, wherein the material of the partial fin core structures 651, 652 may serve as seed material for the SEG growth of the layer 754.

Clearly, by applying a selective epitaxial growth, the two adjacent fin-like extensions (i.e., the first and second partial fin core structures 651, 652) that were initially separated by the gap 653, are merged together by the epitaxial layer 754 that grows selectively on the crystalline material (e.g., the silicon material) of the first and second partial fin core structures 651, 652. The epitaxial silicon layer 754 grows between the two adjacent partial fin core structures 651, 652 and forms a narrow connection or bridge between the formerly adjacent regions (e.g., in a similar manner as illustrated in connection with FIGS. 5A to 5C). Furthermore, the silicon layer 754 grows on all exposed silicon surfaces (that is, for example, also on the sidewalls and the top surface of the first and second partial fin core structures 651, 652, and on the sidewalls and the top surface of the first and second contact regions 603, 604) thereby increasing the thickness and the height of the silicon shapes. The cross-sectional view shown in FIG. 7D provides insight into the composition of the fin region of the first silicon shape (that includes the first partial fin core structure 651) after the formation of the SEG layer 754 on the first partial fin core structure 651.

The thickness $t_{SEG}$ of the epitaxial layer 754 is indicated by the arrows 708 in FIG. 7A. In accordance with one embodiment, $t_{SEG}$ may be in the range from about 50 nm to about 100 nm, although in accordance with other embodiments, $t_{SEG}$ may have a different value. In general, the layer 754 may be grown with such a thickness that it closes the gap 653 between the first and second partial fin core structures 651, 652, or, alternatively the gap 653 may have a dimension that is about less than two times the thickness of the epitaxial layer 754 (i.e., $g<2\times t_{SEG}$), as described above.

Clearly, FIGS. 7A to 7D show an electrical fuse device 700 in accordance with an embodiment.

The electrical fuse device 700 includes a fin structure 702. The fin structure 702 includes a first section 702a (defined by that portion of the layer 754 that is formed between the first and second partial fin core structures 651, 652) that has a first width and a first height, and a second section 702b (defined by the first partial fin core structure 651 and that portion of the layer 754 that is formed on the first partial fin core structure 651) that has a second width and a second height. As can be seen from FIGS. 7A to 7D, the first width (i.e., the width of the first section 702a of the fin structure 702) is smaller than the second width (i.e., the width of the second section 702b of the fin structure 702) and the first height (i.e., the height of the first section 702a) is lower than the second height (i.e., the height of the second section 702b). The fin structure 702 further includes a third section 702c (defined by the second partial fin core structure 652 and that portion of the layer 754 that is formed on the second partial fin core structure 652) that has approximately the same width and height as the second section 702b. The second section 702b and the third section 702c of the fin structure 702 are electrically connected with each other via the first section 702a arranged between the second and third sections 702b, 702c.

Clearly, the first section 702a of the fin structure 702 includes (or defines) a fusible link region 712 of the electrical fuse device 700 arranged in the center of the fin structure 702. The fusible link region 712 is formed by the SEG silicon 754 and has a lower height and a narrower width as compared to the other portions of the fin structure 702 (i.e., the second section 702b and the third section 702c), as can be seen from FIG. 7C, which shows a transversal cross-section through the fusible link region 712 in the first section 702a of the fin structure 702, and from FIG. 7D, which shows a transversal cross-section through the second section 702b of the fin structure 702, and also as compared to the contact regions 603, 604.

Although the electrical fuse device 700 in accordance with the embodiment is shown to have a symmetrical fin structure 702 with the fusible link region 712 (or first section 702a) located in the center of the fin structure 702, it is noted that in accordance with other embodiments, the fusible link region 712 (or first section 702a) may be arranged off-center. In other words, the electrical fuse device 700 may have an asymmetrical structure. In still other words, the length of the second section 702b may be different from the length of the third section 702c.

Figure 9A:
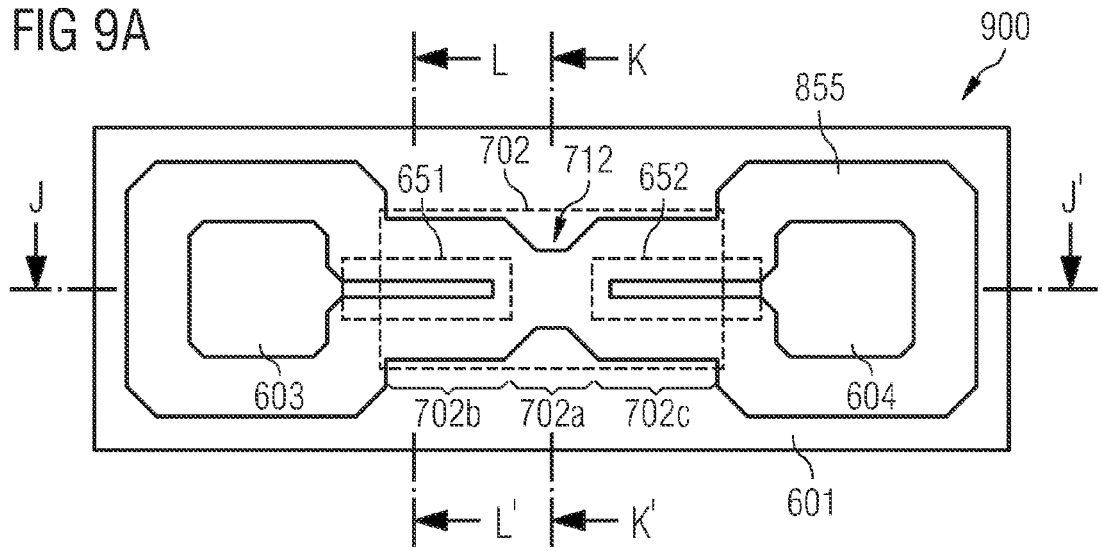
Figure 9B:
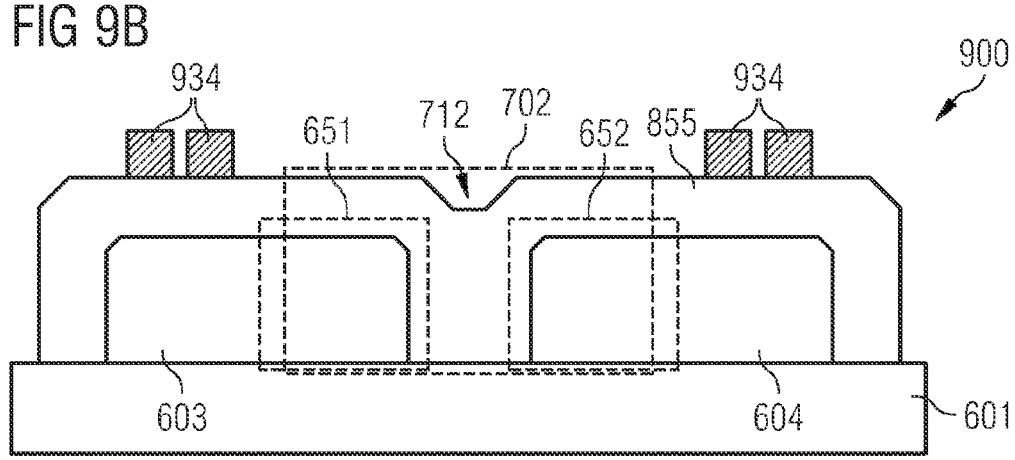

In accordance with another embodiment, electrical contacts may be formed on or above the first and second contact regions 603, 604 in order to electrically contact the electrical fuse device 700 (not shown, see, e.g., FIG. 9B). The contacts may, for example, be formed using standard processes.

In FIG. 7A to FIG. 7C, the fusible link region 712 is shown to have both a smaller width and a lower height than the other portions (i.e., the second and third sections 702b, 702c) of the fin structure 702. In accordance with other embodiments, though, the fusible link region 712 may only have a smaller width or a lower height than the other portions of the fin structure 702. In accordance with some embodiments, the fusible link region 712 may have a smaller cross-sectional area than the second section 702b and/or the third section 702c of the fin structure 702.

FIG. 8A to FIG. 8D show an electrical fuse device 800 in accordance with another embodiment. FIG. 8A is a surface-parallel cross-sectional view of the device 800, while FIG. 8B is a longitudinal cross-section along the line F-F', FIG. 8C is a transversal cross-section along the line G-G' and FIG. 8D is a transversal cross-section along the line H-H' shown in FIG. 8A.

The electrical fuse device 800 is different from the electrical fuse device 700 in that the silicon layer 754 is partially silicided after its formation. In other words, the silicon layer 754 is partially transformed into a silicide 855. To put it in still other words, a silicide layer 855 is formed in or on all exposed surfaces of the silicon layer 754. By means of the silicidation, the narrow fusible link region 712 of the fin structure 702 is fully silicided. In other words, the fusible link region 712 is fully transformed into a silicide 855. In accordance with an alternative embodiment, the fusible link region 712 of the fin structure 702 may only be partially silicided. In other words, by means of the silicidation the fusible link region 712 may be only partially transformed into a silicide 855. FIG. 8C shows a transversal cross-section through the fusible link region 712 of the fin structure 702 after formation of the silicide 855. As can be seen, the fusible link region 712 is fully transformed into a silicide 855 (in accordance with an alternative embodiment, the fusible link region may only be partially silicided). The cross-sectional view shown in FIG. 8D provides insight into the composition of the second section 702*b* of the fin structure 702 after the partial silicidation of the silicon layer 754.

The electrical fuse device 800 may be fabricated in a similar manner as described above in connection with the electrical fuse device 700, with additional partial silicidation of the silicon layer 754. In accordance with an embodiment, the silicidation may be achieved by means of a standard silicidation process. Clearly, the fusible link region 712 of the fin structure 702 may be either fully (as shown) or partially transformed into a silicide 855 by means of the silicidation process.

Figure 9C:
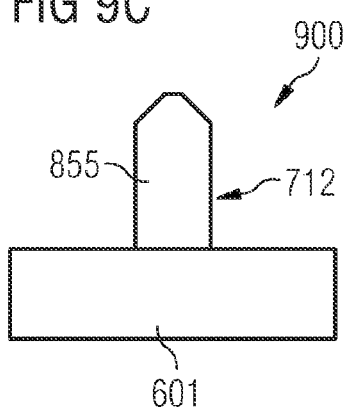
Figure 9D:
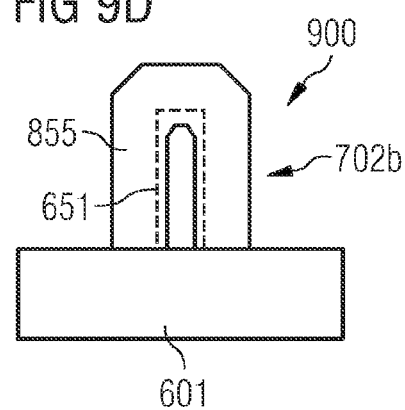

FIG. 9A to FIG. 9D show an electrical fuse device 900 in accordance with another embodiment. FIG. 9A is a surface-parallel cross-sectional view of the device 900, while FIG. 9B is a longitudinal cross-section along the line J-J', FIG. 9C is a transversal cross-section along the line K-K' and FIG. 9D is a transversal cross-section along the line L-L' shown in FIG. 9A.

The electrical fuse device 900 is different from the electrical fuse device 700 in that the silicon layer 754 is fully silicided after its formation. In other words, the silicon layer 754 is fully transformed into a silicide 855 such that the narrow fusible link region 712 in the first section 702*a* of the fin structure 702 is fully transformed into a silicide 855. FIG. 9C shows a transversal cross-section through the fully silicided fusible link region 712 of the fin structure 702, and the cross-sectional view shown in FIG. 8D provides insight into the composition of the second section 702*b* of the fin structure 702 after the full silicidation of the SEG layer 754.

In accordance with the embodiment shown in FIGS. 9A to 9D, portions of the first and second partial fin core structures 651, 652 and portions of the first and second contact regions 603, 604 are also transformed into a silicide 855.

The electrical fuse device 900 may be fabricated in a similar manner as described above in connection with the electrical fuse device 700, with additional full silicidation of the silicon layer 754. In accordance with an embodiment, the silicidation may be achieved by means of a standard silicidation process. Clearly, the fusible link region 712 is fully silicided by means of the silicidation process.

In accordance with another embodiment, the first and second partial fin core structures 651, 652 and/or the first and second contact regions 603, 604 may also be fully silicided, in other words, entirely transformed into a silicide (not shown).

The electrical fuse device 900 further includes electrical contacts 934 formed on or above the first and second contact regions 603, 604 in order to make electrical contact to the electrical fuse device 900. The contacts 934 may, for example, be formed using standard processes.

FIGS. 10A, 10B and 11A to 11D show different views illustrating a method for fabricating an electrical device in accordance with another embodiment. In accordance with this embodiment, an electrical fuse device (or E-fuse) is provided that may, for example, be used in FinFET or SOI technologies.

Figure 10A:
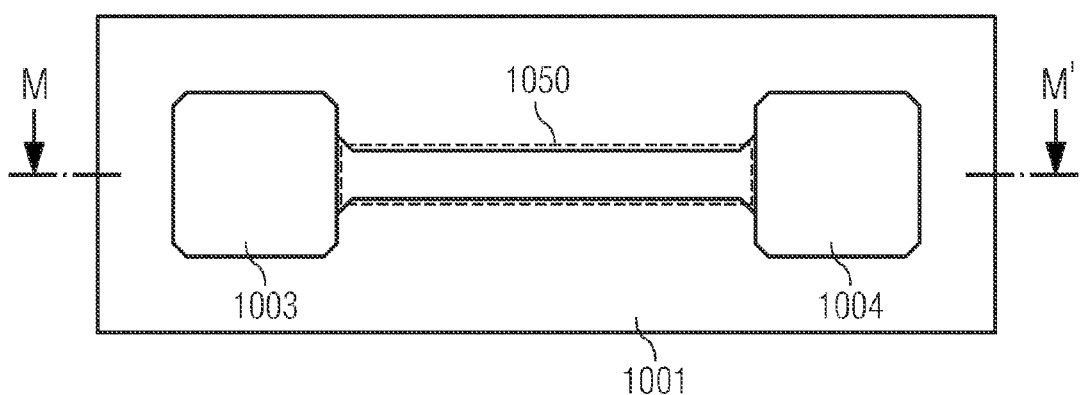
Figure 10B:
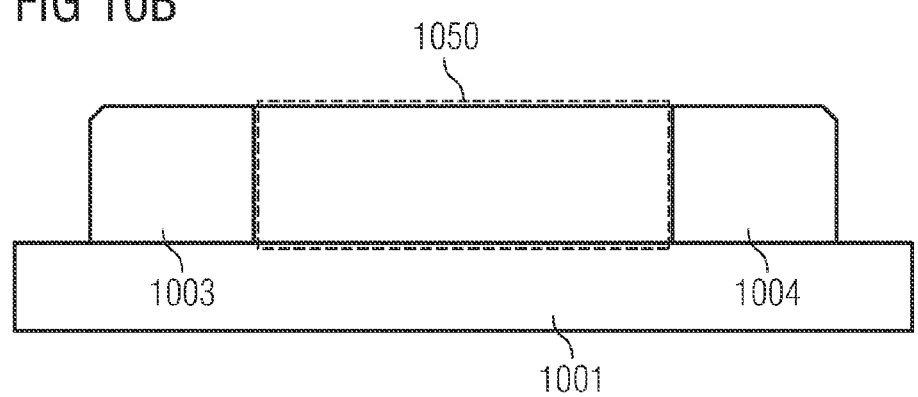

FIG. 10A and FIG. 10B show that a fin core structure 1050 is formed on a silicon-on-insulator (SOI) substrate 1001. In accordance with other embodiments, different substrates (e.g. silicon bulk substrates) may be used. The SOI substrate 1001 may include a buried oxide (BOX) layer, and the fin core structure 1050 may be formed on the buried oxide layer of the substrate 1001.

FIG. 10A is a surface-parallel cross-sectional view (in other words, a layout drawing) while FIG. 10B is a longitudinal cross-section along the line M-M' shown in FIG. 10A.

In accordance with the embodiment shown, the core structure 1050 consists of silicon material with any doping. In accordance with other embodiments, the fin core structure 1050 may include or may be made of other crystalline materials, e.g., other semiconductor materials such as, for example, compound semiconductor materials (e.g., SiGe, GaAs or other materials).

A first contact region 1003 is formed adjacent to and abuts one end of the fin core structure 1050, and a second contact region 1004 is formed adjacent to and abuts an opposite end of the fin core structure 1050. The first and second contact regions 1003, 1004 may be used to electrically contact the electrical fuse device to be formed. In accordance with the embodiment shown, the first and second contact regions 1003, 1004 also consist of silicon, although, in accordance with other embodiments the first and second contact regions 1003, 1004 may include or may be made of other crystalline materials, e.g., other semiconductor materials. In accordance with one embodiment, the first and second contact regions 1003, 1004 may include or may be made of the same material or materials as the fin core structure 1050.

Clearly, FIG. 10A and FIG. 10B show the formation of a single silicon shape on the substrate 1001 including the fin core structure 1050 and the first and second contact regions 1003, 1004. Clearly, according to this embodiment, the primary active fin region of the electrical fuse device is formed as one piece in contrast to the embodiments described herein above in connection with FIGS. 6A to 9D.

The single silicon shape may, for example, be formed by use of a standard FinFET or SOI process technology. For example, in accordance with an embodiment, an SOI wafer material (including a silicon film arranged on or above a buried oxide (BOX) layer) may be used. The silicon film may be structured using, for example, standard lithographical processes (using, e.g., a photomask) and etch processes such that the fin region (i.e., the fin core structure 1050) the first and second contact regions 1003, 1004 are formed on the substrate 1001 (e.g., on the buried oxide layer of the SOI substrate) in accordance with the layout drawing of FIG. 10A.

Figure 11A:
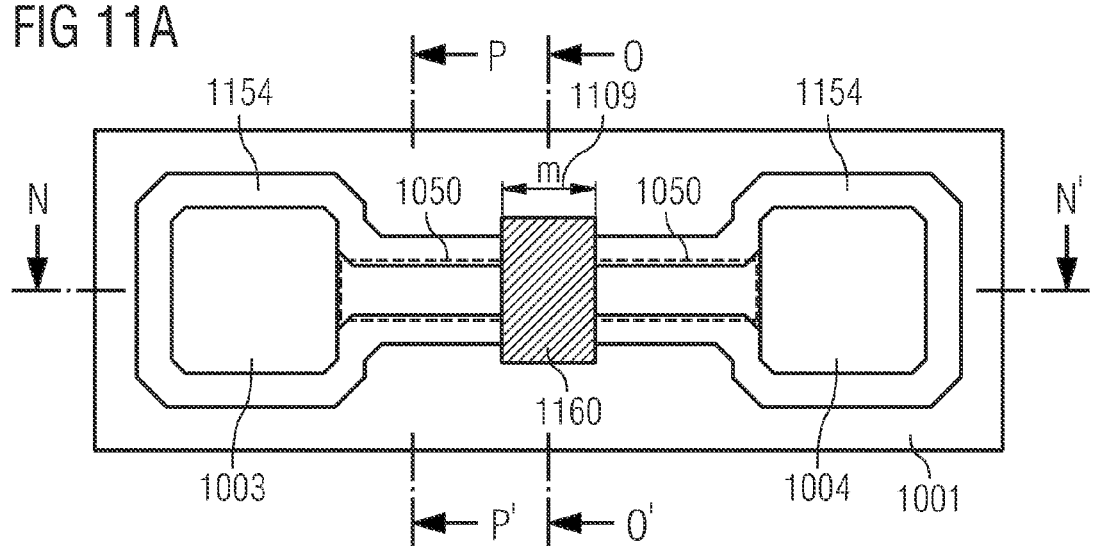
Figure 11B:
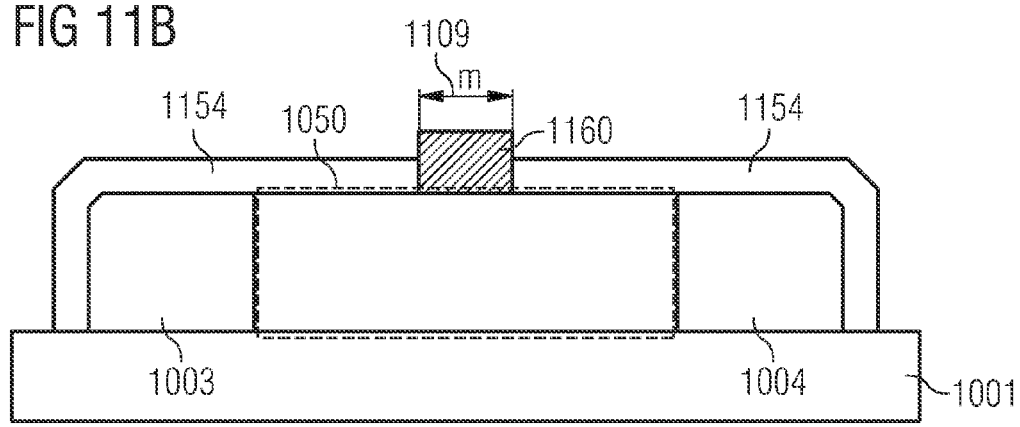
Figure 11C:
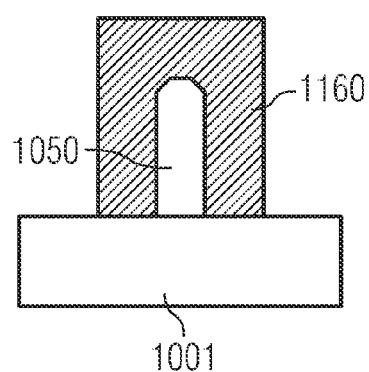
Figure 11D:
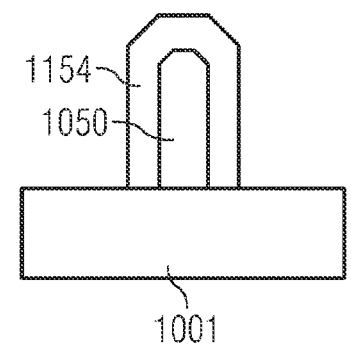

FIGS. 11A to 11D show that a layer 1154 is formed on the fin core structure 1050, wherein the formation of the layer 1154 is blocked in a portion of the fin core structure 1050. FIG. 11A is a surface-parallel cross-sectional view of the resulting structure 1100, while FIG. 11B is a longitudinal cross-section along the line N-N', FIG. 11C is a transversal cross-section along the line O-O' and FIG. 11D is a transversal cross-section along the line P-P' shown in FIG. 11A.

The layer 1154 is a silicon layer that is formed on the fin core structure 1050 (and also on the first and second contact regions 1003, 1004) using a selective epitaxial growth (SEG) process as described herein above, wherein the silicon material of the fin core structure 1050 and the first and second contact regions 1003, 1004 serves as seed silicon for the SEG process. In accordance with other embodiments, for example in case that the fin core structure 1050 and/or the first and second contact regions 1003, 1004 include or are made of other (crystalline) materials, also the layer 1154 may include or may be made of other materials. For example, the layer 1154 may include or may be made of any material or materials that may be grown epitaxially on the material of the fin core structure 1050 and/or the contact regions 1003, 1004.

As shown, the formation or growth of the epitaxial silicon layer 1154 is blocked in a center portion of the fin core structure 1050. In accordance with other embodiments, the formation of the silicon layer 1154 may be blocked in a portion of the fin core structure 1050 located off-center.

In accordance with the embodiment shown, the blocking is achieved by means of a blocking layer 1160 that is formed on a portion of the sidewalls and the top surface of the fin core structure 1050. In accordance with one embodiment, the blocking layer 1160 may be a nitride layer. In accordance with other embodiments, though, the blocking layer 1160 may include or may be made of other materials.

Clearly, by means of the blocking layer 1160 the growth of SEG silicon is locally blocked in a center portion of the fin core structure 1050. In other words, the SEG blocking layer 1160 enables SEG growth only on or above those exposed silicon surfaces that are not covered by the blocking material (e.g., nitride material). The blocking layer 1160 has a dimension "m" (indicated by the double arrow 1109 in FIG. 11A and FIG. 11B) in the direction parallel to the longitudinal axis of the fin core structure 1050.

Clearly, by applying a selective epitaxial growth, the silicon layer 1154 grows on all uncovered portions of the fin core structure 1050 (e.g., on all uncovered portions of the sidewalls and the top surface of the fin core structure 1050) such that the thickness and height of these uncovered portions of the fin core structure 1050 are increased. Furthermore, the silicon layer 1154 grows on all exposed silicon surfaces of the first and second contact regions 1003, 1004.

After the formation of the layer 1154, the SEG blocking layer 1160 may be removed as is shown in FIG. 12A to FIG. 12D. Alternatively, the SEG blocking layer 1160 may be kept and may serve as a silicide blocking layer in a subsequent silicidation process as described herein below.

Clearly, FIGS. 12A to 12D show an electrical fuse device 1200 in accordance with an embodiment, wherein FIG. 12A is a surface-parallel cross-sectional view of the device 1200, while FIG. 12B is a longitudinal cross-section along the line Q-Q', FIG. 12C is a transversal cross-section along the line R-R' and FIG. 12D is a transversal cross-section along the line S-S' shown in FIG. 12A.

The electrical fuse device 1200 includes a fin structure 1202. The fin structure 1202 includes a first section 1202a (defined by the center portion of the fin core structure 1050 that was blocked from the SEG growth and is thus not covered by the silicon layer 1154) that has a first width and a first height, and a second section 1202b (defined by a first portion of the fin core structure 1050 covered by the silicon layer 1154) that has a second width and a second height. As can be seen from FIGS. 12A to 12D, the first width (i.e., the width of the first section 1202a of the fin structure 1202) is smaller than the second width (i.e., the width of the second section 1202b of the fin structure 1202), and the first height (i.e., the height of the first section 1202a) is lower than the second height (i.e., the height of the section 1202b). The fin structure 1202 further includes a third section 1202c (defined by a second portion of the fin core structure 1050 covered by the silicon layer 1154) that has approximately the same width and height as the second section 1202b. The second section 1202b and the third section 1202c of the fin structure 1202 are electrically connected with each other via the first section 1202a arranged between the second and third sections 1202b, 1202c.

Clearly, the first section 1202a of the fin structure 1202 includes (or defines) a fusible link region 1212 of the electrical fuse device 1200 arranged in the center of the fin structure 1202. The fusible link region 1212 is formed by blocking the SEG growth in the center portion of the fin core structure 1050 such that the silicon layer 1154 is prevented from growing in that center portion. Thus, the fusible link region 1212 (or section 1202a) of the fin structure 1202 has a lower height and a narrower width as compared to the other portions of the fin structure 1202 (i.e., the second section 1202b and the third section 1202c), as can be seen from FIG. 12C and FIG. 12D which show transversal cross-sections through the fusible link region 1212 and the second section 1202b of the fin structure 1202, respectively.

Although the electrical fuse device 1200 in accordance with the embodiment is shown to have a symmetrical fin structure 1202 with a centered fusible link region 1212, it is noted that in accordance with other embodiments, the fusible link region 1212 (or the first section 1202a) may be arranged off-center. In other words, the electrical fuse device 1200 may have an asymmetrical structure.

In accordance with another embodiment, electrical contacts may be formed on or above the first and second contact regions 1003, 1004 in order to electrically contact the electrical fuse device 1200 (not shown, see e.g. FIG. 13B). The contacts may, for example, be formed using standard processes.

In FIG. 12A to FIG. 12C, the fusible link region 1212 is shown to have both a smaller width and a lower height than the other portions (i.e., the second and third sections 1202b, 1202c) of the fin structure 1202. In accordance with other embodiments, though, the fusible link region 1212 may only have a smaller width or a lower height than the other portions of the fin structure 1202. This may, for example, be achieved by using an appropriate blocking layer or mask in the blocking of the SEG growth, in accordance with an embodiment. In accordance with some embodiments, the fusible link region 1212 may have a smaller cross-sectional area than the second section 1202b and/or the third section 1202c of the fin structure 1202.

FIG. 13A to FIG. 13D show an electrical fuse device 1300 in accordance with another embodiment. FIG. 13A is a surface-parallel cross-sectional view of the device 1300, while FIG. 13B is a longitudinal cross-section along the line T-T', FIG. 13C is a transversal cross-section along the line U-U' and FIG. 13D is a transversal cross-section along the line V-V' shown in FIG. 13A.

The electrical fuse device 1300 is different from the electrical fuse device 1200 in that the silicon layer 1154 is partially silicided after its formation. In other words, a silicide layer 1355 is formed in or on all exposed surfaces of the silicon layer 1154. By means of the silicidation, the narrow fusible link region 1212 in the first section 1202a of the fin structure 1202 is fully silicided. In other words, the fusible link region 1212 is fully transformed into a silicide 1355. In accordance with an alternative embodiment, the fusible link region 1212 may only be partially silicided. In other words, by means of the silicidation the fusible link region 1212 may be only partially transformed into a silicide 1355.

FIG. 13C shows a transversal cross-section through the fully silicided fusible link region 1212, and the cross-sectional view shown in FIG. 13D provides insight into the composition of the second section 1202b of the fin structure 1202 after the partial silicidation of the silicon layer 1154.

The electrical fuse device 1300 may be fabricated in a similar manner as described above in connection with the electrical fuse device 1200, with additional partial silicidation of the silicon layer 1154. In accordance with an embodiment, the silicidation may be achieved by means of a standard silicidation process. The silicidation may either fully (as shown) or partially transform the narrow center portion of the fin structure 1202 into a silicided fusible link region 1212. The length "n" of the fusible link region (indicated by arrows 1310 in FIG. 13A) may be determined by the dimension "m" of the blocking layer 1160 (see FIGS. 11A and 11B), which may be mask-defined. Thus, the length of the fusible link region 1212 may be a function of layout parameters and thus less dependent on the processing technology.

In accordance with another embodiment, the silicon layer 1154 may be fully silicided, in other words, fully transformed into a silicide. Furthermore, in accordance with other embodiments, also the SEG covered fin and contact regions may be partially or fully silicided. In other words, the fin core structure 1050 may be partially or fully silicided in the second section 1202b and/or third section 1202c of the fin structure 1202, and the first and second contact regions 1003, 1004 may also be partially or fully silicided.

In accordance with another embodiment, the blocking layer 1160 (e.g., a nitride layer used for SEG blocking) may optionally remain on and atop of the fin during silicidation such that a silicidation of the fusible link region may be prevented. Thus, an electrical fuse device with an unsilicided fusible link region may be provided.

FIG. 14 shows a method 1400 for fabricating an electrically programmable fuse (E-fuse) using selective epitaxial growth (SEG) in accordance with an embodiment.

As shown in 1402, a silicon-on-insulator (SOI) wafer material may be provided. The SOI wafer material may include a silicon film arranged over a buried oxide (BOX) layer.

Furthermore, as shown in 1404, a photomask may be used, and adjacent silicon regions ("fin regions") may be formed according to a given layout drawing (for example, one of the layout drawings shown herein above).

Furthermore, as shown in 1406, various processing steps of a standard process flow (e.g., a standard FinFET process flow), e.g., for gate stack formation, gate formation or implantation, may be used in accordance with an embodiment.

Furthermore, as shown in 1408, a selective epitaxial growth (SEG) process may be applied to merge and overgrow the adjacent silicon fin regions.

Furthermore, as shown in 1410, the fusible link region may be silicided in accordance with an embodiment. Furthermore, the fin regions may be partially or fully silicided in accordance with an embodiment.

Furthermore, as shown in 1412, contacts may be formed in accordance with an embodiment.

In the following, additional features and potential effects of illustrative embodiments are described.

FinFET and SOI devices may be highly susceptible to damage by Electrical Overstress (EOS) or Electrostatic Discharge (ESD) events. Among the reasons for this are both the extremely small geometrical structures of the narrow fins (e.g., silicon fins) as well as the strong thermal insulation of the fins. In accordance with some embodiments, this property is used to provide electrically programmable fuse devices (E-fuse devices) having a reduced programming power.

A reduction of MOSFET source/drain series resistance for FinFET technology optimization may be done by the process option of Selective Epitaxial Growth (SEG). Silicon may be grown by epitaxy on all exposed surfaces of an existing silicon shape (also referred to as "seed silicon"). Such growth of the silicon cross-section is typically intended for regular MOS devices for the fin portion between the contacts and the active channel. As described herein, in accordance with some embodiments, the SEG is used for the formation of devices with a variable size in fin cross-section and where gaps in the seed silicon are bridged. These devices may also be referred to as "FinFuse" devices. The modulation in silicon cross-section may be used to create high local current densities that may be applied for the programming of E-fuses. In accordance with some embodiments, a bridge-region with a narrow cross-section is used as a fusible link between adjacent silicon regions. In accordance with some embodiments, the "FinFuse" may be partly covered with silicide or may be fully silicided.

An electrical device in accordance with one embodiment includes a fin structure including a first section and a second section, wherein in the first section the fin structure has a first width and a first height, wherein in the second section the fin structure has a second width and a second height, and wherein the first width is smaller than the second width and the first height is lower than the second height.

An electrical device in accordance with another embodiment includes a fin structure including a first section and a second section, wherein in the first section the fin structure has a smaller width and a lower height than in the second section.

An electrical device in accordance with another embodiment includes a fin structure, wherein a first section of the fin structure is narrowed in at least a first dimension and a second dimension with respect to a second section of the fin structure, the second dimension being different from the first dimension.

An electrical fuse device in accordance with one embodiment includes a fin structure including a first fin region and a second fin region, and a fusible link region electrically connecting the first and second fin regions with each other, wherein in the fusible link region the fin structure has a smaller width and a lower height than in the first and second fin regions. In accordance with one embodiment, the fin structure includes a fin core structure and an epitaxial layer formed selectively on the fin core structure in the first and second fin regions. In accordance with another embodiment, the first fin region includes a first partial fin core structure, the second fin region includes a second partial fin core structure, and the fin structure includes an epitaxial layer formed selectively on the first and second partial fin core structures in the fusible link region such that the first and second fin regions are electrically connected with each other by means of the epitaxial layer.

In accordance with some embodiments, electrical fuse devices or electrical fuses (E-fuses) for FinFET or SOI technologies are provided. In accordance with one embodiment, an E-fuse may be formed by the use of Selective Epitaxial Growth (SEG).

Electrical fuse devices in accordance with some embodiments may include one or more of the following features:

an electrical fuse device in accordance with one embodiment may be fabricated using only existing process steps without introduction of additional photo masks;

an electrical fuse device in accordance with another embodiment may have a reduced programming power compared to conventional fuse devices, which may be due to its reduced geometrical size;

the physical core of a fusible link region of an electrical fuse device in accordance with another embodiment may include or may consist of selectively epitaxially grown silicon (SEG);

in accordance with another embodiment, the SEG-formed regions may be bridging two adjacent silicon extensions;

an electrical fuse device in accordance with another embodiment may have a fusible link region that is both narrower and shallower;

in accordance with another embodiment, the fusible link region of the electrical fuse device may be, by its geometry and material composition, used for significant resistance increase and/or rupture in case that a programming current is injected into the electrical fuse device.

In accordance with one embodiment, a programmable fuse device for MuGFET or SOI technologies and a fabrication method are provided, including the following features, as outlined below.

Two shapes of silicon (comprising "seed silicon") are structured such that they each define a fin region (fin) and a contact region. The fins are adjacent and define a gap. The seed silicon is overgrown by SEG silicon. As a consequence, the gap is closed by SEG silicon to form a conductive and fusible link region. The fusible link region may be narrower and/or thinner than the fin regions and the contact regions to allow for self-heating (which may lead to thermal rupture) and increased current density (which may lead to depletion of material, for example, by electromigration) in the link region.

In accordance with one embodiment, the fusible link region may include or may be made of silicon.

In accordance with another embodiment, the fusible link region may include or may be made of a silicide material which may have a lower thermal degradation point compared to silicon. Another effect of a silicided fusible link region may be that electromigration as a fusing mechanism may be supported.

In accordance with some embodiments, forming the narrow and/or shallow fusible link region may be realized by means of partially silicided SEG silicon or fully silicided SEG silicon.

In accordance with some embodiments, the connecting fin regions may also be silicided. One effect of silicided connecting fin regions may be a low-ohmic behavior.

In accordance with another embodiment, a single shape (or piece) of silicon (comprising "seed silicon") is structured such that it defines a single fin region (fin). The seed silicon is overgrown by SEG silicon, wherein the SEG growth on the fin is prevented (in other words, blocked) locally by application of local SEG blocking (e.g., using a blocking layer). By means of the SEG growth, those regions of the fin that are not blocked are increased in their thickness and height, while the thickness and/or height of the blocked region of the fin remains approximately unchanged. Thus, the blocked region of the fin may be narrower and/or shallower than the regions of the fin covered with SEG silicon, such that the blocked region may define a fusible link region. In accordance with some embodiments, the SEG growth may be followed by a partial or full silicidation of the link region and/or the SEG silicon layer.

In accordance with some embodiments, the used SEG silicon may be a standard part of advanced FinFET technologies. In accordance with one embodiment, the thickness $t_{SEG}$ of the SEG layer may be in the range from about 50 nm to about 100 nm, although in accordance with other embodiments, the SEG layer may have a different thickness.

In accordance with another embodiment, the gap "g" (or, in other words, the shortest distance) between the fins formed by seed silicon may be less than about two times the thickness $t_{SEG}$ of the SEG layer (i.e., $g<2\times t_{SEG}$) to allow for a reliable closing of the gap.

In accordance with one embodiment, an electrical device (for example, an electrical fuse device) with a fin structure is provided, wherein a portion of the fin structure (for example, a portion of a fin region of the fin structure, e.g., a portion of an active fin region) is both narrower in width and lower in height than the other portions of the fin structure. The portion with the narrower width and the lower height may form a predetermined break point or rupture point of the device. In other words, the fin structure may have a predetermined break point or rupture point in two dimensions.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for fabricating an electrical device, the method comprising:
forming a fin structure on a substrate, wherein the fin structure comprises a first section comprising a first width and a first height, and a second section comprising a second width and a second height, wherein the first width is smaller than the second width and the first height is lower than the second height, wherein forming the fin structure comprises:
forming a first partial fin core structure and a second partial fin core structure of a crystalline semiconductor material on the substrate, the first and second partial fin core structures being separated by a gap; and
growing an epitaxial semiconductor layer of the crystalline semiconductor material selectively on the first and second partial fin core structures, wherein the epitaxial semiconductor layer bridges the gap and forms an electrically conductive link of the crystalline semiconductor material between the first and second partial fin core structures.

2. The method of claim 1, wherein the fin structure is formed such that it further comprises a third section comprising a third width and a third height, wherein the first width is smaller than the third width and the first height is lower than the third height, and wherein the second and third sections of the fin structure are electrically connected with each other via the first section of the fin structure.

3. The method of claim 1, wherein after formation of the epitaxial semiconductor layer, the epitaxial semiconductor layer is at least partially silicided.

4. A method for fabricating an electrical fuse device, the method comprising:
forming a first fin and a second fin of a crystalline semiconductor material on a substrate, the first and second fins being separated by a gap; and
growing an epitaxial layer of the crystalline semiconductor material on the first and second fins such that a fusible link region of the crystalline semiconductor material is formed in the gap between the first and second fins, thereby bridging the gap between the first and second fins with the epitaxial layer.

5. The method of claim 4, further comprising fully siliciding the epitaxial layer.

6. The method of claim 4, further comprising partially siliciding the epitaxial layer.

7. The method of claim 6, further comprising fully siliciding the fusible link region.

8. A method for fabricating an electrical fuse device, the method comprising:
forming a fin on a substrate, the fin comprising a top surface and sidewalls, wherein the top surface of the fin is parallel to a top surface of the substrate that faces the fin;
forming a blocking layer on a portion of the sidewalls and the top surface of the fin, wherein the blocking layer traverses the fin along a width direction of the fin, wherein the width direction is parallel to the top surface of the substrate and perpendicular to a current flow direction in the fin; and
growing an epitaxial layer on the fin, wherein a portion of the fin is blocked from the epitaxial growth by the blocking layer thereby forming a fusible link region of the fin.

9. The method of claim 8, further comprising at least partially siliciding at least one of the fusible link region and the epitaxial layer.

10. The method of claim 8, further comprising:
removing the blocking layer after growing the epitaxial layer.

11. The method of claim 8, further comprising:
siliciding the epitaxial layer; and
removing the blocking layer after siliciding the epitaxial layer.

12. A method for fabricating an electrical fuse device, the method comprising:
forming a fin on a substrate, the substrate comprising a top surface facing the fin;
forming a blocking layer on the fin so that the blocking layer covers a top surface and sidewalls of a central region of the fin, wherein the blocking layer traverses the fin along a width direction of the fin, wherein the top surface of the central region of the fin is parallel to the top surface of the substrate and the sidewalls of the central region are perpendicular to the top surface of the substrate, and wherein the width direction is parallel to the top surface of the substrate and perpendicular to a current flow direction in the central region of the fin;
growing an epitaxial layer on exposed regions of the fin while the central region of the fin is covered by the blocking layer;
removing the blocking layer; and
siliciding the epitaxial layer and the central region of the fin.

13. The method of claim 12, wherein the blocking layer is an isolation layer.

14. The method of claim 13, wherein the isolation layer is a nitride layer.

15. The method of claim 12, wherein siliciding comprises partially siliciding the epitaxial layer and the central region of the fin.

16. The method of claim 12, wherein siliciding comprises partially siliciding the epitaxial layer and fully siliciding the central region of the fin.

17. The method of claim 12, wherein siliciding comprises fully siliciding the epitaxial layer and the central region of the fin.

* * * * *